United States Patent [19]
Mitin et al.

[11] 3,988,743
[45] Oct. 26, 1976

[54] DEVICE FOR RECORDING INFORMATION IN THE FORM OF SIGNS ON A LIGHT-SENSITIVE MATERIAL BY MEANS OF A LIGHT BEAM AND A LIGHT-BEAM OSCILLOGRAPH BUILT AROUND SAID DEVICE

[76] Inventors: Igor Viktorovich Mitin, Bratskaya ulitsa, 15, korpus 3, kv. 24; Mstislav Semenovich Aralov, 2 Obydensky pereulok, 12, kv. 28, both of, Moscow, U.S.S.R.

[22] Filed: May 14, 1975

[21] Appl. No.: 577,791

[52] U.S. Cl. ............................................ 346/109
[51] Int. Cl.² .......................................... G01D 9/42
[58] Field of Search .......................... 346/108–110

[56] References Cited
UNITED STATES PATENTS

| | | | |
|---|---|---|---|
| 3,082,407 | 3/1963 | Warnick et al. | 346/109 X |
| 3,208,075 | 9/1965 | Casavant | 346/33 R |
| 3,298,029 | 1/1967 | Silverman | 346/109 X |
| 3,618,121 | 11/1971 | Baur | 346/109 |
| 3,626,459 | 12/1971 | Haflinger et al. | 346/76 |
| 3,701,999 | 10/1972 | Congleton et al. | 346/76 |

*Primary Examiner*—George H. Miller, Jr.

[57] ABSTRACT

The proposed device for recording information in the form of signs of a light-sensitive material by means of a light beam comprises a galvanometer. The rotation axis of the mirror of said galvanometer is parallel to the direction of movement of the light-sensitive material whereon information is recorded in the form of signs by means of a light beam reflected from the mirror and shifted by said mirror along the surface of said light-sensitive material. The galvanometer is controlled by a sign-forming unit which is a quantized lever circuit whose output is electrically coupled to the galvanometer, whereas its inputs are connected to outputs of a logical matrix. Entered into the information inputs of the matrix is decimal-coded information corresponding to a sign to be represented and read out by means of pulses arriving from a pulse distributor connected to the readout inputs of the matrix and controlled by a reference frequency generator. The design of the proposed device ensures a sign recording rate of 200 to 300 signs per second.

3 Claims, 11 Drawing Figures

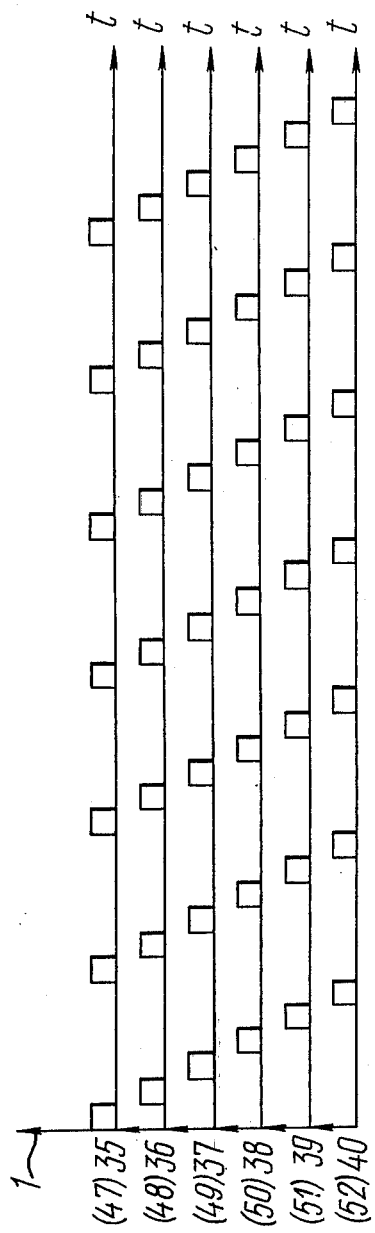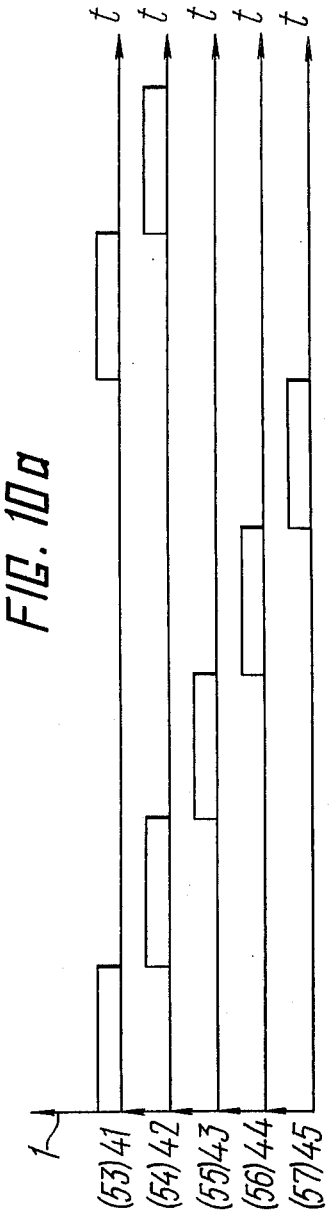

DEVICE FOR RECORDING INFORMATION IN THE FORM OF SIGNS ON A LIGHT-SENSITIVE MATERIAL BY MEANS OF A LIGHT BEAM AND A LIGHT-BEAM OSCILLOGRAPH BUILT AROUND SAID DEVICE

The present invention relates to electrical measuring instruments and, more particularly, to a device for recording information in the form of signs on a light-sensitive material by means of a light beam and a light-beam oscillograph built around said device, which oscillograph is intended for recording information both in the form of signs and in combination with information in the form of analogs and is employed, in the main, in electrical measuring and computer engineering.

The progress in computer technology necessitates the recording and processing of great masses of information in the form of signs, especially digital information, which is recorded by different types of electromechanical printing machines, such as digital and alphabetic printers. In such printers the sign recording rate in one channel is normally not higher than 20 to 30 signs per second. In addition, such printers are not reliable enough.

There is known a device for recording information in the form of signs on a light-sensitive material by means of a light beam, which device comprises a light source whose light beam is formed by a means for representing information in the form of signs and projected in the form of signs on the light-sensitive material which is moved by means of a tape transport mechanism.

In this device the means for representing information in the form of signs is a drum carrying signs on the lateral surface thereof and rotatable in accordance with a predetermined program. The light beam produced by the light source is directed at a respective sign and projects it on the light-sensitive material. The number of sign-carrying drums determines the number of data recording channels in this device.

The design of the foregoing device is such that the rate of recording signs on the light-sensitive material is never higher than 20 to 30 signs per second. The information recorded on the light-sensitive material through each channel is determined by the signs carried by the drum for the respective recording channel. Besides, this device is too complicated in its design, as it requires an individual light source for each channel, as well as an optical system for projecting a sign on the light-sensitive material.

Digital information is known to give a vivid idea about numerical values of a parameter at discrete points, yet it gives no idea about the changing of the parameter with time between its discrete values. For the reason, there is extensively used another type of information, analog information, which gives a good idea about continuous changes with time in a parameter. However, the latter type of information is disadvantageous in that it makes it difficult to determine a parameter's values at specific points.

For recording analog information, extensive use is being made of light-beam oscillographs which make it possible to record on a light-sensitive material and through a plurality of channels different types of electrical processes within a broad range of frequencies and with different signal levels. That notwithstanding, users of oscillograms have to decode multichannel analog information recordings, i.e. to assess that information quantitatively, which assessment includes numerical representation of time intervals, as well as marking out recording numbers, dates and other reference information. Being done manually, these operations take much time and thus hinder prompt use of information obtained. It would be practicable therefore to simultaneously record on oscillograms both analog and digital information, for it would make it possible to simultaneously represent on an oscillogram, in the course of recording, discrete values of parameters being recorded, and also represent digitally time intervals and record other auxiliary information.

The use for these purposes of conventional digital printers makes it necessary to evolve new, sophisticated composite information recording apparatus, which would combine multichannel operation and digital-analog information recording.

Conventional graph plotters with electrochemical recording only provide for numerical representation of time intervals, but are incapable of digitally recording multichannel information at any point on the oscillogram. In addition, such graph plotters are bulky and complicated in design.

For example, the Lumenskryptt-300 light-beam, oscillograph manufactured by the Hartmann and Braun Company of Federal Germany is only capable of enumerating oscillograms and measuring channels by automatically exposing to light three-digit numbers carried on a rotatable transparent drum.

There is also known a light-beam oscillograph comprising at least one galvanometer whose mirror reflects a light beam produced by a light source, directing it at a light-sensitive material drawn by a tape transport mechanism. Said oscillograph simultaneously records, with the aid of the light beam, analog information and information in the form of signs, the latter type of information recording being carried out with the aid of a means for representing information in the form of signs.

In this light-beam oscillograph the mechanism for representing information in the form of signs is constructed, the way it has been described above, as a programmably rotatable drum carrying numerals at the lateral surface thereof. The drum is employed for recording dates, as well as numbers of modes and oscillograms. Another drum having a light source of its own and an optical system is used for recording numerical time marks.

The light-beam oscillograph of the latter type only makes it possible to record in an oscillogram predetermined digital information to a preselected scale and at a limited speed, which considerably limits the sphere of its application, It is an object of the present invention to provide a device for recording information in the form of signs on a light-sensitive material by means of a light beam, as well as an oscillograph based upon said device, which would have greater functional potentialities, as compared to conventional equipment.

The foregoing object is attained by providing a device for recording information in the form of signs on a light-sensitive material with the aid of a light beam, comprising a light source whose light beam is formed by a means for representing information in the form of signs and projected on the light-sensitive material drawn by a tape transport mechanism, wherein the means for representing information in the form of signs comprises, in accordance with the invention, a reference frequency generator, a pulse distributor whose input is connected to the output of the generator, a logical matrix, applied to whose inputs is decimal-coded information sent by a source of information, which information corresponds to a sign being represented and is read out by the pulse distributor whose outputs are connected to read out inputs of the matrix, a quantized level circuit whose inputs are connected to the outputs of the logical matrix, as well as a galvanometer electrically coupled to the output of the quantized level circuit, said galvanometer having a mirror whose rotation axis is parallel to the direction of movement of the light-sensitive material and which reflects the light beam and shifts it along the surface of the light-sensitive material in the direction perpendicular to that of the movement of said light-sensitive material.

It is expedient that the means for representing information in the form of signs have at least one additional logical matrix, applied to whose inputs is information from an additional source of information, its read-out inputs being connected to the outputs of the pulse distributor, additional quantized level circuits whose number corresponds to that of the additional matrices, the inputs of each of said additional quantized level circuits being connected to the outputs of the respective additional matrices, and additional galvanometers whose number is equal to that of the additional matrices, which galvanometers are electrically coupled to the outputs of the respective additional quantized level circuits.

The object of the present invention is further attained by providing a light-beam mirror which reflects a light beam sent by a light source, directing it at a light-sensitive material drawn by a tape transport mechanism, said light-sensitive material reproducing with the aid of said light beam recording analog information simultaneously with recording information in the form of signs, which recording is carried out with the aid of a means for representing information in the form of signs, in which oscillograph the function of the means for representing information in the form of signs is performed, in accordance with the invention, by the above-mentioned device for recording information in the form of signs on a light-sensitive material by a light beam, the light source, the tape transport mechanism and the light-sensitive material drawn by said mechanism being common for the light-beam oscillograph and said information recording device.

The proposed device for recording information in the form of signs on a light-sensitive material by means of a light beam and the light beam oscillograph built around said device ensure a high rate of information recording in each channel, which rate amounts to 200 to 300 signs per second, and make it possible to record information at any point on the light-sensitive material and to a any scale. The light beam oscillograph of the present invention also makes it possible to employ any combinations of analog and sign information recording channels and change over in each recording channel from one type of the information to the other.

Other objects and advantages of the present invention will become more apparent from the following detailed description of preferred embodiments thereof taken in conjunction with the accompanying drawings, wherein:

FIG. 10 ($a$ and $b$) shows time plots of readout pulses arriving from the pulse distributor of the proposed device.

Figure 1:
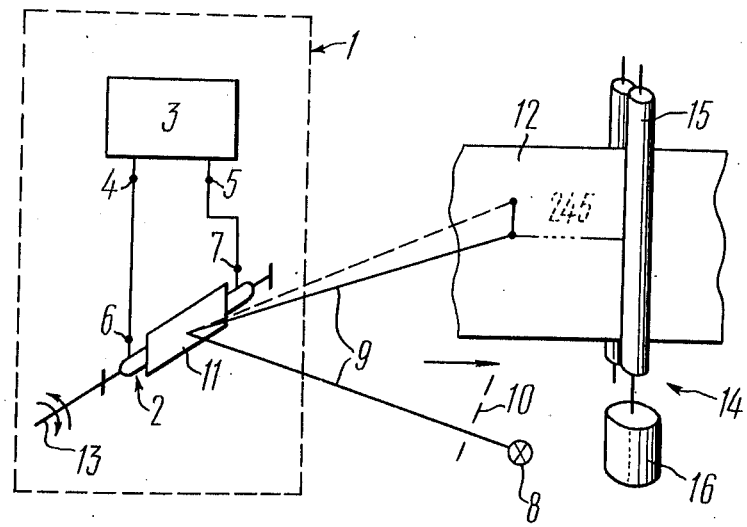
FIG. 1 is a key diagram of the proposed device for recording information in the form of signs on a light-sensitive material by means of a light beam.

Referring now to the accompanying drawings, the proposed device for recording information in the form of signs on a light-sensitive material with the aid of a light beam comprises a means 1 (FIG. 1) for representing information in the form of signs, which means 1 includes a galvanometer 2 and a sign forming unit 3 whose outputs 4 and 5 are connected to inputs 6 and 7 of the galvanometer 2. The means 1 further includes a light source 8 producing a light beam 9 which is formed by an aperture 10 and is incident on a mirror 11 of the galvanometer 2. The mirror 11 reflects the light beam and directs it at a light-sensitive material 12. The mirror 11 is arranged so that its rotation axis 13 is parallel to the direction of the movement of the light-sensitive material 12 which in the present embodiment is photo paper drawn by a tape transport mechanism 14 in the direction indicated by the arrow. The mechanism 14 includes rollers 15 with the light-sensitive material 12 being interposed therebetween, said rollers 15 being set in motion by an electromotor 16.

Under the action of pulses applied to the galvanometer 2, the mirror 11 turns with respect to the axis 13 and shifts the light beam 9 along the surface of the light-sensitive material in the direction perpendicular to that of the movement of said light-sensitive material 12.

Figure 2:
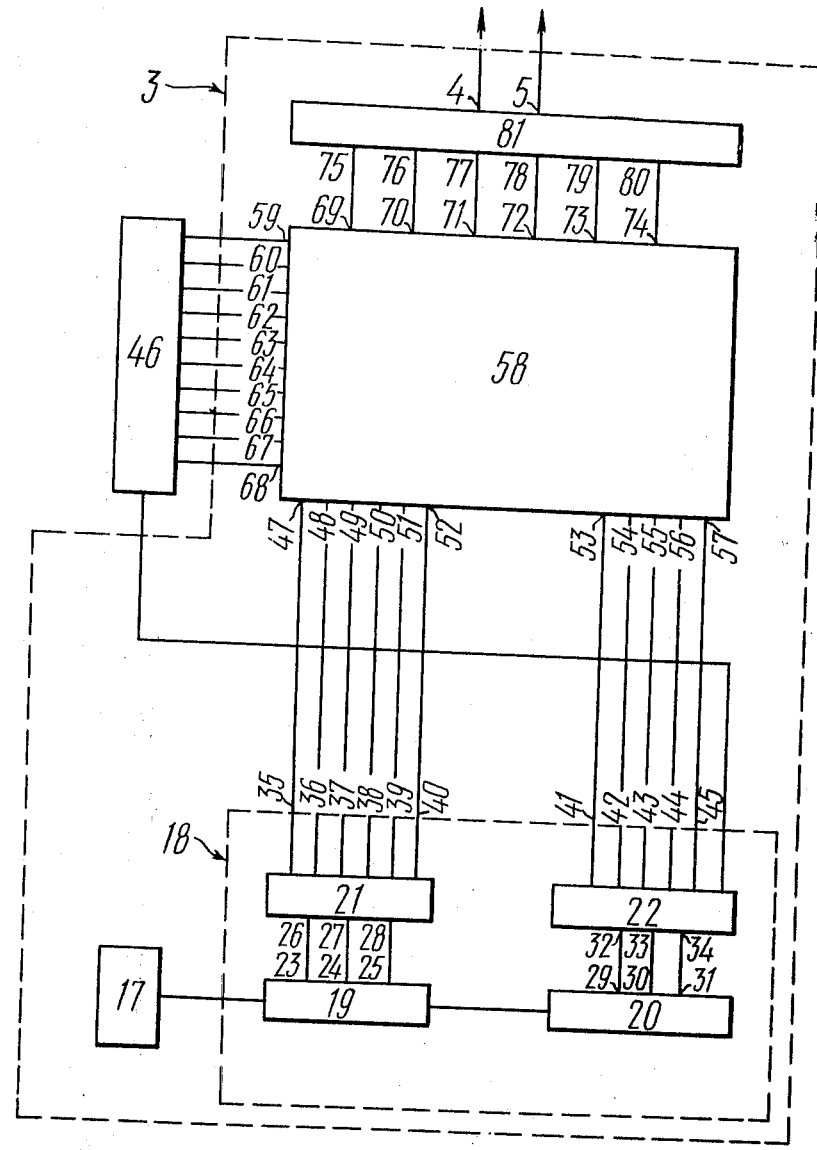
FIG. 2 is a functional diagram of the proposed device with the use of one information recording channel.

Said sign forming unit 3 comprises a reference frequency generator 17 (FIG. 2) whose output is connected to an input of a pulse distributor 18 which is also incorporated in the sign forming unit 2. In the embodiment under review the function of the generator 17 is performed by a free-running multivibrator.

The pulse distributor 18 is built around two counters 19 and 20 and two decoders 21 and 22, each of said decoders having six outputs, the count input of the counter 19 being the input of the pulse distributor 18, whereas the pulse output of the counter 19 is connected to the count input of the counter 20.

Three potential outputs 23, 24 and 25 of the counter 19 are connected to inputs 26, 27 and 28 of the decoder 21, three potential outputs 29, 30 and 31 of the counter 20 being connected to three inputs 32, 33 and 34 of the decoder 22.

Outputs 35, 36, 37, 38, 39 and 40 of the decoder 21 and outputs 41, 42, 43, 44 and 45 of the decoder 22 are outputs of the pulse distributor 18. In the present embodiment a signal arriving from the sixth output of the decoder 22 is used as a sign recording termination signal, for which purpose it is sent to an information source 46 whose function is performed by a decimal computer.

In the embodiment under review the counters 19 and 20 and the decoders 21 and 22 are constructed in accordance with known circuitries described, for example, in the book by I. V. Bukreyev, B. M. Mansurov and V. I. Goryachev, "Microelectronnye schemy v tsifrovykh ustroistvakh" /"Microelectronic Circuits in Digital Devices"/, Sovietskoye Radio Publishers, 1973, pp. 135, 201.

Said outputs of the decoders 21 and 22 are connected to inputs 47, 48, 49, 50, 51, 52, 53, 54, 55, 56 and 57, respectively, of a logical digital matrix 58 which is also incorporated in the sign forming unit 3.

Figure 3:
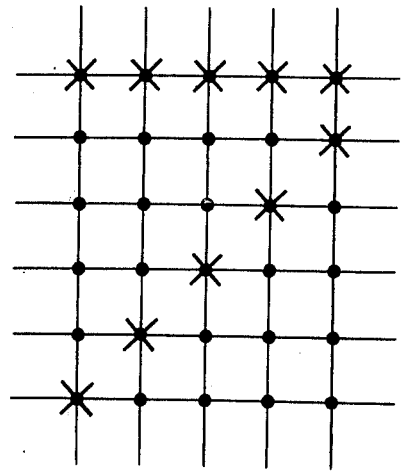
FIG. 3 is a digit-forming reference grid in the logical matrix of the proposed device.

For better understanding of the present invention FIG. 3 shows a sign representation reference grid having five rows, each row comprising six levels. The grid is used to construct the logical matrix 58 comprising AND-to-OR and OR logical circuits.

Entered in inputs 59 (FIG. 2), 60, 61, 62, 63, 64, 65, 66, 67 and 68 of the logical matrix 58 from the information source 46 is a parallel decimal code corresponding to a certain sign (digit).

Outputs 69, 70, 71, 72, 73 and 74 of the logical matrix 58 are connected to inputs 75, 76, 77, 78, 79 and 80 of a quantized level circuit 81 which is also incorporated in the sign forming unit 3 whose outputs 4 and 5, which are outputs of the sign forming unit 3, are connected to the inputs 6 (FIG. 1) and 7 of the galvanometer 2.

Figure 4:
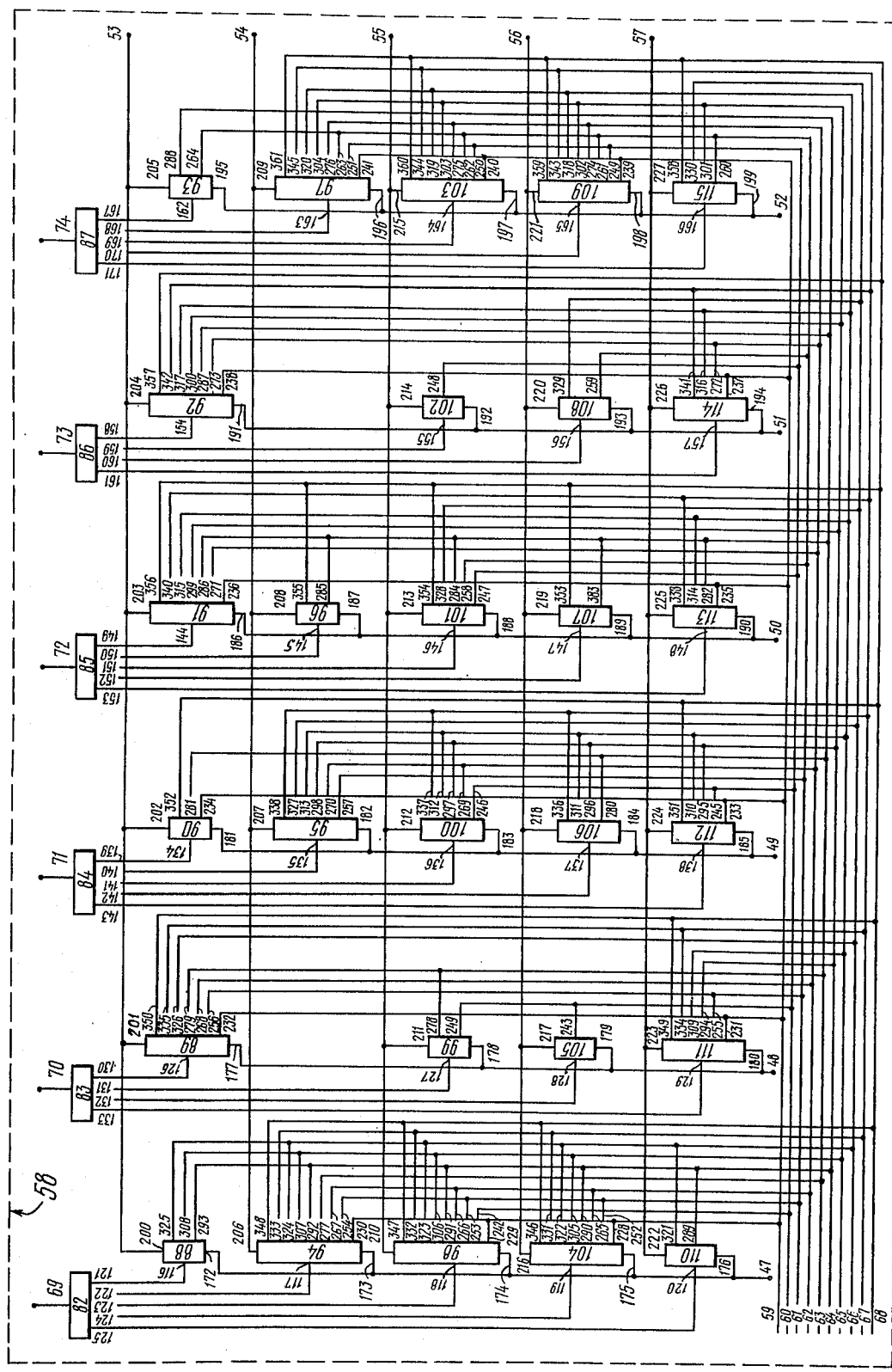
FIG. 4 is a key diagram of a logical matrix for digit forming.

The logical matrix 58 (FIG. 4) comprises six logical OR circuits 82, 83, 84, 85, 86 and 87 and twenty-eight logical AND-to-OR circuits 88, 89, 90, 91, 92, 93, 94, 95, 96, 97, 98, 99, 100, 101, 102, 103, 104, 105, 106, 107, 108, 109, 110, 111, 112, 113, 114 and 115. The outputs 69, 70, 71, 72, 73 and 74 of the logical circuits 58 are the outputs of the logical OR circuits 82, 83, 84, 85, 86 and 87, inputs of each of said circuits being electrically coupled to outputs of the four and five AND-to-OR logical circuits located at the nodes of a reference grid corresponding to a sign representation reference grid.

Thus, the logical AND-to-OR circuits 88, 94, 98, 104 and 110 are related to the first level of points (potentials) in a sign representation, their outputs 116, 117, 118, 119 and 120 being connected to inputs 121, 122, 123, 124 and 125 of the logical OR circuit 82.

The logical AND-to-OR circuits 89, 99, 105 and 111 are related to the second point level, and their outputs 126, 127, 128 and 129 are connected to inputs 130, 131, 132 and 133 of the logical OR circuit 83. In this case there are four logical AND-to-OR circuits, as one point in the reference grid is not included in the digit representation.

The logical AND-to-OR circuits 90, 95, 100, 106 and 112 are related to the third point level, and their outputs 134, 135, 136, 137 and 138 are connected to inputs 139, 140, 141, 142 and 143 of the logical OR circuit 84.

The logical AND-to-OR circuits 91, 96, 101, 107 and 113 correspond to the fourth point level, and their outputs 144, 145, 146, 147 and 148 are connected to inputs 149, 150, 151, 152 and 153 of the logical OR circuit 85.

The logical AND-to-OR circuits 92, 102, 108 and 114 correspond to the fifth point level, and their outputs 154, 155, 156 and 157 are connected to inputs 158, 159, 160 and 161 of the logical OR circuit 86.

The logical AND-to-OR circuits 93, 97, 103, 109 and 115 correspond to the sixth point level, and their outputs 162, 163, 164, 165 and 166 are connected to inputs 167, 168, 169, 170 and 171 of the logical OR circuit 87.

The inputs 47, 48, 49, 50, 51 and 52 of the logical matrix 58 are intended for level readout, whereas the inputs 53, 54, 55, 56 and 57 are intended for row readout.

Thus, corresponding to the first level is the input 47 connected to inputs 172, 173, 174, 175 and 176 of the logical AND-to-OR circuits 88, 94, 98, 104 and 110. Corresponding to the second level is the input 48 connected to inputs 177, 178, 179 and 180 of the logical AND-to-OR circuit 89, 99, 105 and 111. Corresponding to the third level is the input 49 connected to inputs 181, 182, 183, 184 and 185 of the logical AND-to-OR circuits 90, 95, 100, 106 and 112. Corresponding to the fourth level is the input 50 connected to inputs 186, 187, 188, 189 and 190 of the logical AND-to-OR circuits 91, 96, 101, 107 and 113. Corresponding to the fifth level is the output 51 connected to inputs 191, 192, 193 and 194 of the logical AND-to-OR circuits 92, 102, 108 and 114. Corresponding to the sixth level is the input 52 connected to inputs 195, 196, 197, 198 and 199 of the logical AND-to-OR circuits 93, 97, 103, 109 and 115.

Corresponding to the first readout row is the input 53 of the logical matrix 58, connected to inputs 200, 201, 202, 203, 204 and 205 of the logical AND-to-OR circuits 88, 89, 90, 91, 92 and 93. Corresponding to the second row is the input 54 connected to inputs 206, 207, 208 and 209 of the logical AND-to-OR circuits 94, 95, 96 and 97. Corresponding to the third row is the input 55 connected to inputs 210, 211, 212, 213, 214 and 215 of the logical AND-to-OR circuits 98, 99, 100, 101, 102 and 103. Corresponding to the fourth row is the input 56 connected to inputs 216, 217, 218, 219, 220 and 221 of the logical AND-to-OR circuits 104, 105, 106, 107, 108 and 109. Corresponding to the fifth row is the input 57 connected to inputs 222, 223, 224, 225, 226 and 227 of the logical AND-to-OR circuits 110, 111, 112, 113, 114 and 115.

In the present embodiment the order numbers of rows and levels are arbitrary.

The inputs 59, 60, 61, 62, 63, 64, 65, 66, 67 and 68 of the logical matrix 58 are connected to the logical matrix 58 are connected to the logical AND-to-OR circuits so that the number of inputs of the logical matrix 58 should correspond to the number of signs for which the matrix is designed. In the present embodiment the matrix 58 is designed for 10 digits from 0 to 9. Each information input of the matrix 58 is connected to the inputs of the logical AND-to-OR circuits involved in the presentation of a respective sign. Thus, the input 59, wherethrough there passes a signal corresponding to the digit "0", is connected to inputs 228, 229, 230, 231, 232, 233, 234, 235, 236, 237, 238, 239, 240 and 241 of the logical AND-to-OR circuits 104, 98, 94, 111, 89, 112, 90, 113, 91, 114, 109, 103 and 97.

The input 60, wherethrough there passes a signal corresponding to the digit "1", is connected to inputs 242, 243, 244, 245, 246, 247, 248, 249, 250 and 251 of the logical AND-to-OR circuits 98, 105, 99, 112, 100, 101, 102, 109, 103 and 97.

The input 61, wherethrough there passes a signal corresponding to the digit "2", is connected to inputs 252, 253, 254, 255, 256, 257, 258, 259, 260, 261, 262, 263 and 264 of the logical AND-to-OR circuits 104, 98, 94, 111, 89, 95, 101, 108, 115, 109, 103, 97 and 93.

The input 62, wherethrough there passes a signal corresponding to the digit 3, is connected to inputs 265, 266, 267, 268, 269, 270, 271, 272, 273, 274, 275 and 276 of the logical AND-to-OR circuits 104, 98, 94, 89, 100, 95, 91, 114, 92, 109, 103 and 97.

The input 63, wherethrough there passes a signal corresponding to the digit 4, is connected to inputs 277, 278, 279, 280, 281, 282, 283, 284, 285, 286, 287 and 288 of the logical AND-to-OR circuits 94, 99, 89, 106, 90, 113, 107, 101, 96, 91, 92 and 93.

The input 64, wherethrough there passes a signal corresponding to the digit 5, is connected to inputs 289, 290, 291, 292, 293, 294, 295, 296, 297, 298, 299, 300, 301, 302, 303 and 304 of the logical AND-to-OR circuits 110, 104, 98, 94, 88, 111, 112, 106, 100, 95, 91, 92, 115, 109, 103 and 97.

The input 65, wherethrough there passes a signal corresponding to the digit 6, is connected to inputs 305, 306, 307, 308, 309, 310, 311, 312, 313, 314, 315, 316, 317, 318, 319 and 320 of the logical AND-to-OR circuits 104, 98, 94, 88, 111, 112, 106, 100, 95, 113, 91, 114, 92, 109, 103 and 97.

The input 66, wherethrough there passes a signal corresponding to the digit 7, is connected to inputs 321, 322, 323, 324, 325, 326, 327, 328, 329 and 330 of the logical AND-to-OR circuits 110, 104, 98, 94, 88, 89, 95, 101, 108 and 115.

The input 67, wherethrough there passes a signal corresponding to the digit 8, is connected to inputs 331, 332, 333, 334, 335, 336, 337, 338, 339, 340, 341, 342, 343, 344 and 345 of the logical AND-to-OR circuits 104, 98, 94, 111, 89, 106, 100, 95, 113, 91, 114, 92, 109, 103 and 97.

The input 68, wherethrough there passes a signal corresponding to the digit 9, is connected to inputs 346, 347, 348, 349, 350, 351, 352, 353, 354, 355, 356, 357, 358, 359, 360 and 361 of the logical AND-to-OR circuits 104, 98, 94, 111, 89, 112, 90, 107, 101, 96, 91, 92, 115, 109, 103 and 97.

Figure 5:
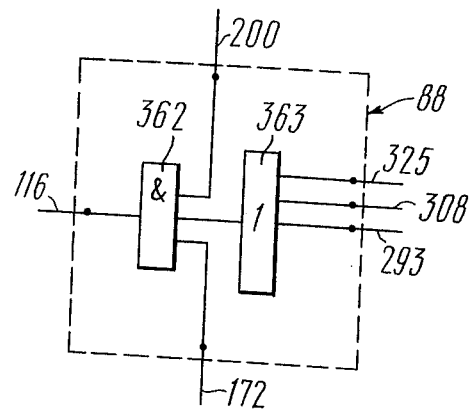
FIG. 5 is a key diagram of AND-to-OR logical circuits of the logical matrix.

All the above-mentioned logical AND-to-OR circuits which make up the logical matrix 58 are circuits that fulfil the OR function with two suppressions. FIG. 5 shows a logical AND-to-OR circuit corresponding to the number 88, which is made up of two seriesly connected logical OR circuits 362 and 363 and has one output 116, three information inputs 325, 308 and 293 and two inhibiting inputs 200 and 172.

All the twenty-eight AND-to-OR logical circuits 88 through 115 which make up the logical matrix 58 are alike and differ from one another only in the number of information inputs.

Figure 6:
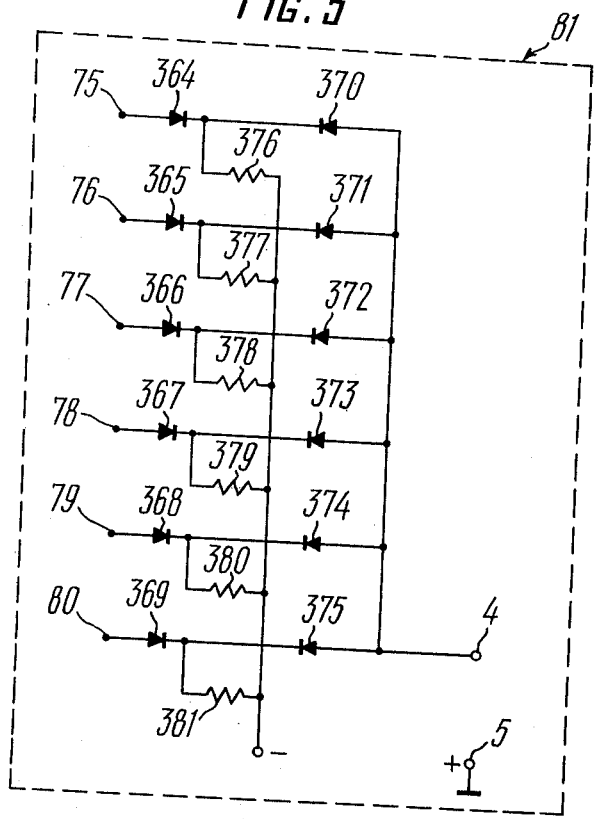
FIG. 6 is a key diagram of the quantized level circuit of the proposed device.

The quantized level circuit 81 (FIG. 2) is constructed as a weighting current circuit. Its inputs 75 through 80 are the anodes of diodes 364 (FIG. 6), 365, 366, 367, 368 and 369 whose cathodes are connected to the cathodes of diodes 370, 371, 372, 373, 374 and 375, respectively, and to one of the leads of resistors 376, 377, 378, 379, 380, and 381. Other leads of said resistors 376 through 381 are interconnected in parallel and coupled via the resistor 381 to the minus terminal of a power source. The output 4 of the quantized level circuit 81 is the anode of the diodes 370 which are interconnected in parallel.

There may be other embodiments of the quantized level circuit which may be constructed, for example, as a potential level switching circuit.

Figure 7:
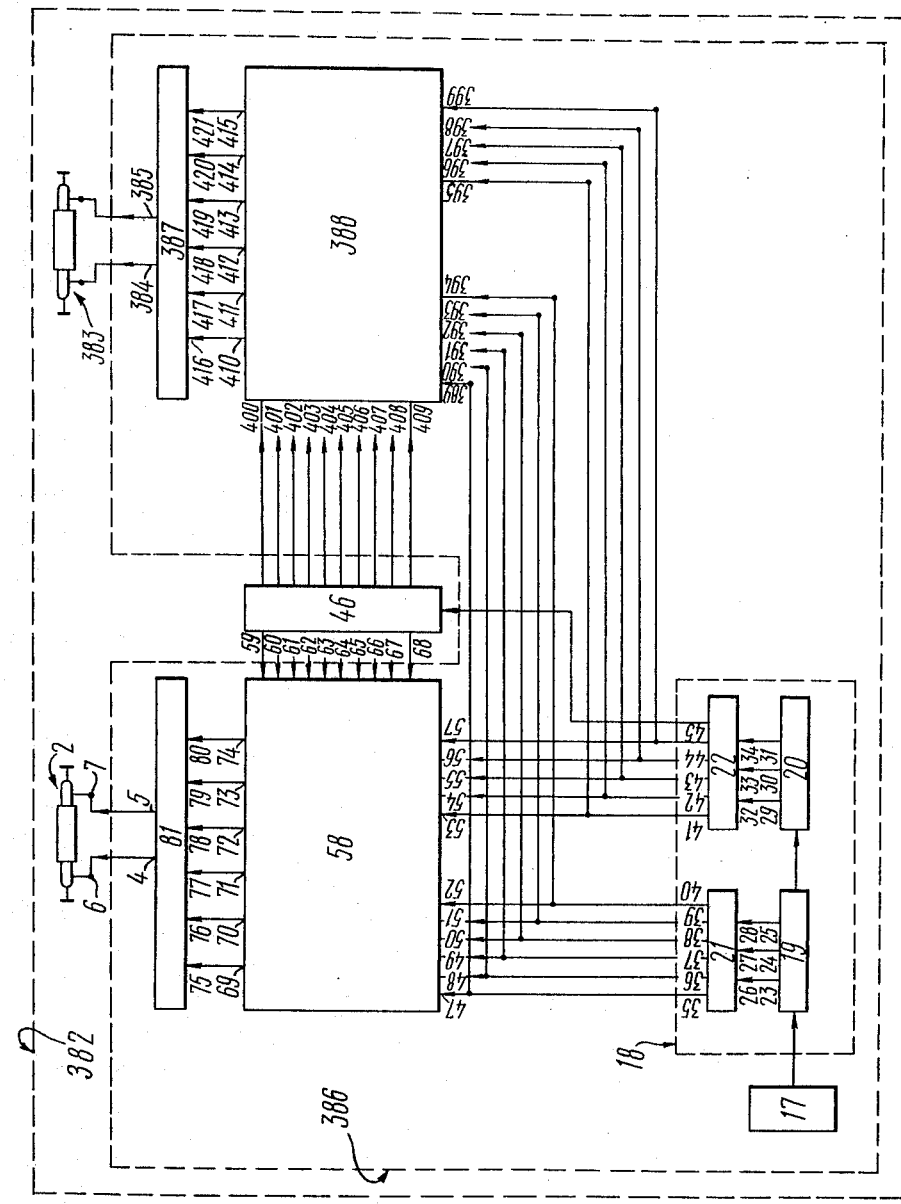
FIG. 7 is a functional diagram of the proposed device with the use of two information recording channels.

If in the proposed device for recording information in the form of signs on a light-sensitive material by means of a light beam recording is carried out through two recording channels, a unit 382 (FIG. 7) for representing information in the form of signs comprises, apart from the galvanometer 2, an additional galvanometer 383 connected to outputs 384 and 385 of a sign forming unit 386. The unit 386 is similar to the sign forming unit 3 and additionally includes a quantized level circuit 387 whose outputs 384 and 385 are outputs of the second recording channel of the unit 386 which also includes a logical matrix 388.

In the presence of two recording channels the pulse distributor 18 is common for the two logical matrices 58 and 388. The outputs 35 through 45 of its decoders 21 and 22 are connected in parallel with the readout inputs 47 through 57 and readout inputs 390, 391, 392, 393, 394, 395, 396, 397, 398 and 399 of both logical matrices 58 and 388.

In the embodiment under review information is entered in the form of a decimal code through the first and second recording channels from the source 46. The information is sent through the first channel to the inputs 59 through 68 of the matrix 58 and through the second channel, to inputs 400, 401, 402, 403, 404, 405, 406, 407, 408 and 409 of the matrix 388 whose outputs 410, 411, 412, 413, 414 and 415 are connected to inputs 416, 417, 418, 419, 420 and 421 of the quantized level circuit 387.

The proposed light beam oscillograph includes a channel for recording analog information, which channel incorporates a galvanometer 422 connected to an analog information source 423 whose function in this embodiment is performed by a temperature transducer. Incident on a mirror 424 of the galvanometer 422 is a light beam 425 from a light source 426, which light beam 425 is formed by an aperture 427, and reflected and directed at a light-sensitive material 428 drawn by a tape transport mechanism 429. The mechanism 429 includes rollers 430 with the light-sensitive material being interposed between said rollers which are set in motion by an electromotor 431.

As a signal from the analog information source 423 arrives at the galvanometer 422, the mirror 424 reflects the light beam 425, directing it at the light-sensitive material 428, whereon there is reproduced a curve which is proportional to a change in the temperature with time.

Simultaneously with recording analog information, there is recorded information in the form of signs on the light-sensitive material 428, with the aid of the means for representing information in the form of signs. Said means is the means for representing information in the form of signs on a light-sensitive material with the aid of a light beam that has been described above. In this embodiment the tape transport mechanism 429, the light-sensitive material 428 and the light source 426 are common for the light beam oscillograph and said device for recording information in the form of signs.

In the light beam oscillograph under review the channel for recording information in the form of signs is used to record numerical values of time intervals and other auxiliary information, such as dates, recording numbers, numbers of oscillograms, etc.

Figure 9:
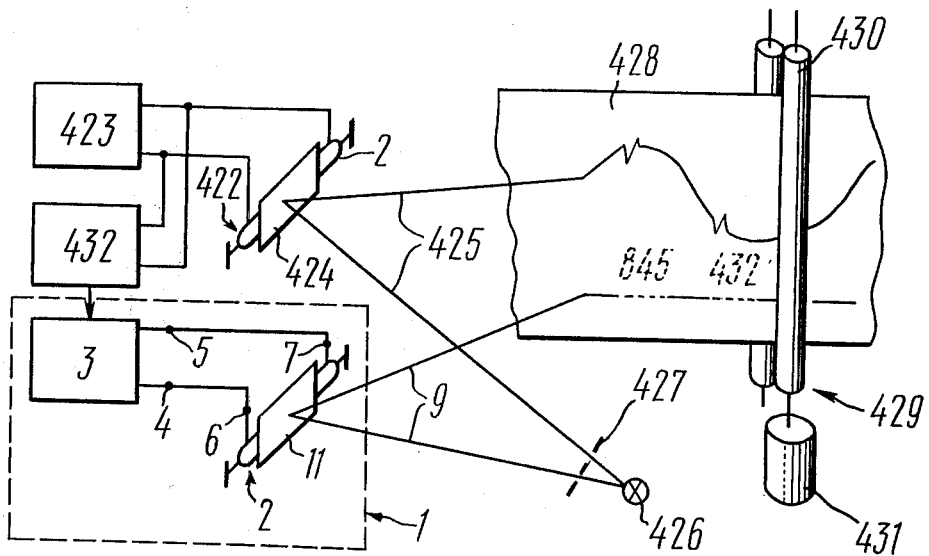
FIG. 9 shows the same, with a common information for the analog and digital information recording channels.

In order to record analog information simultaneously with recording numerical values of analog quantities being measured, the light beam oscillograph of the present invention employs in the function of an information source an analog-digital converter 432 (FIG. 9) whose input is connected to the analog informations source 423, its output being connected to the input of the sign forming unit 3, or, in this embodiment, to the inputs 59 (FIG. 2) through 68 of the matrix 58. In the embodiment under review the converter 432 is the known digital voltmeter of the TR-1652 and EMG-1362/2 types manufactured by the Orion firm of Hungary.

The use of an analog-digital converter in combination with the proposed light beam oscillograph practically dispenses with the arduous task of decoding oscillograms and raises the accuracy of determining a value being measured, which in the present case is temperature.

In the light beam oscillograph of the present invention there may be several analog information recording channels. In this case the oscillograph is provided with additional galvanometers, their number being equal to that of additional recording channels. It can be inferred from the foregoing that there also may be several channels for recording information in the form of signs. Due to the fact that in both types of channels galvanometers are a common structural element, the ratio between the numbers of said channels is selected depending upon specific requirements.

The operation of the proposed device for recording information in the form of signs on a light-sensitive material by means of a light beam is based upon scanning a sign in the form of a series of points by means of a light beam on a moving light-sensitive material.

Signs are formed as a series of points in the logical matrix 58 (FIG. 2) which is a reference grid having in the present embodiment five vertical rows and six horizontal levels, as is shown in FIG. 3.

Information arriving from the source 46 (FIG. 2) in the form of a decimal code is entered in the inputs 59 through 68 of the matrix 58 whose logical AND-to-OR circuits 88 (FIG. 4) through 115 are electrically coupled in correspondence with said reference grid.

From the outputs 35 (FIG. 2) through 40 and 41 through 45 of the pulse distributor 18 there are sent readout pulses to the inputs 47 through 52 and 53 through 57 of the matrix 58, which pulses successively interrogate the logical AND-to-OR circuits 88 (FIG. 4) through 115. As a result, at the output of those interrogated logical circuits which are involved in digit representation there appears a signal 1 which is applied to one of the outputs 69 through 74 of the matrix 58 via a respective logical OR circuit 82 (FIG. 4) through 87.

The readout pulses are generated by the pulse distributor 18 (FIG. 2) which comprises two counters 19 and 20, each having three digits, said counters being connected in series and having a division coefficient equal to 6. The distributor 18 further includes two decoders 21 and 22, each having six outputs and being intended for converting the binary code applied from the outputs 23 through 25 and 29 through 31 of the counters 19 and 20 to the inputs 26 through 28 and 32 through 34 of said decoders 21 and 22, in the sequence of readout pulses.

For better understanding of operation of the pulse distributor FIG. 10 (*a* and *b*) shows a time plot of readout pulses. Plotted as ordinate in FIG. 10*a* is the amplitude of the signal 1 at the outputs 35 through 40 of the decoder 21 (the inputs 47 through 52 of the matrix 58); plotted as ordinate in FIG. 10*b* is the same amplitude at the outputs 41 through 45 of the decoder 22 (the inputs 53 through 57 of the matrix 58). Plotted as abscissa in FIG. 10 (*a* and *b*) is time *t*.

Each logical AND-to-OR circuit 88 (FIG. 4) through 115 of the matrix 58 is interrogated if signals applied to the inputs of these logical circuits are matched in level and row, respectively. As is seen from the plot of FIG. 10, the interrogation takes place in the following sequence: a signal arrives at the output 53 (FIG. 2) of the matrix 58, which signal allows interrogation of the first row of the matrix 58, the duration of said signal being equal to the time passing through all the six levels of successive signals applied to the readout inputs 47 through 52. A signal is then applied to the input 54, which signal allows interrogation of the second row of the matrix 58 on all the levels: after that a signal is applied to the inputs 55, 56 and 57.

The last signal from the output of the pulse distributor 18 (from the sixth output of the decoder 22) is applied to the input of the information source 46 and serves as a signal for changing the information in the matrix 58.

For greater clarity operation of the sign forming unit 3 is illustrated by a description of the way the digit 7 is recorded. A signal corresponding to this digit arrives at the sign forming unit 3 from the information source 46 via the input 66 of the matrix 58, which input 66 combines the inputs 321 (FIG. 4), 322, 323, 324, 325, 326, 327, 328, 329 and 330 of the logical AND-to-OR circuits 110, 104, 98, 94, 88, 95, 101, 108 and 115.

In the course of successive interrogation of the matrix 58 by readout pulses there are generated signals 1 at the outputs 116, 126, 117, 135, 118, 146, 119, 156, 120 and 166 of the respective logical AND-to-OR circuits 88, 89, 94, 95, 98, 101, 104, 110 and 115. The logical circuits 88 and 89 correspond to the first row of the reference grid, levels 1 and 2; the logical circuits 94 and 95 correspond to the second row of the reference grid, levels 1 and 3; the logical circuits 98 and 101 correspond to the third row of the reference grid, levels 1 and 4; the logical circuits 101 and 108 correspond to the fourth row of the reference grid, levels 1 and 5; the logical circuits 110 and 115 correspond to the fifth row of the reference grid, levels 1 and 6.

These pulse signals are applied in the foregoing sequence from the outputs 116, 126, 117, 135, 118, 146, 119, 156, 120 and 166, respectively, to the inputs 121, 130, 122, 140, 123, 151, 124, 125 and 171 of the logical AND-to-OR circuits 82 through 87. From the outputs 69 through 74 of said logical circuits 82 through 87 the signals are applied to the inputs 75 through 80 of the quantized level circuits 81 (FIG. 2) which is a weighting current circuit. Corresponding to each of the six inputs of the circuit 81, wherethrough there passes the signal 1, is a specific current magnitude at the outputs 4 and 5 of said circuit 81 and, consequently, a specific deflection angle of the mirror 11 (FIG. 1) of the galvanometer 2.

Different current magnitudes at the outputs 4 and 5 of the circuit 81 (FIG. 6) are attained due to the fact that the resistors 376, 377, 378, 379, 380 and 381, connected to the circuits of the diodes 364 through 375, respectively, have different resistance values. The resistance values of the resistors change in proportion with the current magnitude which has to be at the output of the circuit 81 under the action of a signal applied to the inputs 75, 76, 77, 78, 79 and 80 of said circuit 81.

Under the action of the signals arriving from the outputs 4 and 5 of the quantized level circuit 81 the mirror 11 (FIG. 1) of the galvanometer 2 turns, which causes a deflection of the light beam 9 with respect to the light-sensitive material 12 by a respective magnitude from the zero position.

Thus, in order to record the digit 7, the light beam 9 scans levels 1 and 6 in the first row of the reference grid; levels 1 and 5 in the second row; levels 1 and 4 in the third row; and levels 1 and 2 in the fifth row.

The reference frequency of of the generator 17 (FIG. 2) is matched with the speed V of movement of the light-sensitive material according to the formula V = 1/n, where 1 is the width of a numeral and n is the number of points in the reference grid, which in the present embodiment is equal to 30.

In the case of using two channels for recording information in the form of signs, the sign forming unit 386 (FIG. 7) comprises two matrices 58 and 388 and two quantized level circuits 81 and 387. From the pulse distributor 18 readout pulse are applied simultaneously to the readout inputs 47 through 57 of the matrix 58 and the readout inputs 389 through 399 of the matrix 388.

The process of reading out information from the matrix 388 is similar to that of reading out information from the matrix 58, although the information in the matrix 388 is different from that entered in the matrix 58.

The two galvanometers 2 and 383 employed in the embodiment under review are controlled by pulses arriving from the respective quantized level circuits 81 and 387 and ensure recording on the light-sensitive material 12 (FIG. 1) of signs through two independent recording channels, which raises the amount of information being recorded.

Figure 8:
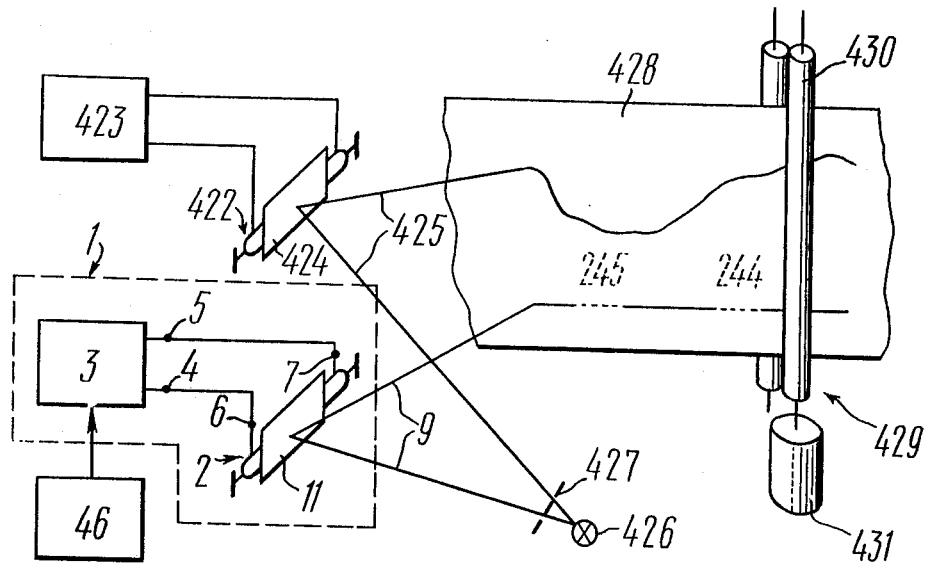
FIG. 8 is a key diagram of the proposed light beam oscillograph.

The light beam oscillograph of the present invention carries out simultaneous recording on the light-sensitive material 428 (FIG. 8) of information in the form of analogs and in the form of signs. In this case the process of recording information in the form of signs is absolutely identical with the one described above.

Analog information recording is carried out with the aid of the galvanometer 422 which is similar to the galvanometer 2 and is controlled by continuously variable current supplied from the analog information source 423.

The operation of the light beam oscillograph, wherein the function of the digital information source is performed by an analog-digital converter, is similar to that described above.

In this embodiment, however, there is a common information source which is the analog information source 423 (FIG. 9), as information is simultaneously entered from its outputs into the galvanometer 422 and the galvanometer 2.

The proposed device for recording information in the form of signs on a light-sensitive material with the aid of a light beam makes it possible to record on a light-sensitive material information in the form of numerals, letters of the alphabet, words and different symbols to any scale and at any point on the light-sensitive material. Recording of information may be performed both through one channel and a plurality of channels, the recording rate being higher by an order than that of conventional printing devices (the device of the present invention records 200 to 300 symbols per second, in contrast to a rate of 20 to 30 symbols per second achieved by conventional devices), which accounts for high efficiency of the proposed device. The use of galvanometers in the proposed device makes it possible to represent signs with the aid of an electrical circuit. Unlike conventional printing devices which use for these purposes electromechanical means, this raises the operation speed of the proposed device and its reliability. This also accounts for the simplicity of servicing the device and, what is extremely important, the possibility of changing over in any recording channels from one type of information to another in case there is a change in the incoming information.

The proposed light beam oscillograph which employs the proposed device for recording information in the form of symbols makes it possible to match on an oscillogram analog information with diverse information in the form of signs, which makes unnecessary decoding of analog parameter values and makes it possible to enter diverse reference information in any place on the oscillogram.

The utilization in all the recording channels of the proposed oscillograph of galvanometers controlled by either analog or sign information sources makes it possible to vary the ratio between these channels, depending upon specific operating conditions.

What is claimed is:

1. A device for recording information in the form of signs on a light-sensitive material by means of a light beam, comprising: a light source; a light beam produced by said light source; a tape transport mechanism; a light-sensitive material transported by said tape transport mechanism; a means for representing information in the form of signs, which means forms said light beam and projects it at said movable light-sensitive material in the form of signs; a reference frequency generator of said means for representing information in the form of signs; a pulse distributor of said means for representing information in the form of signs, whose input is connected to an output of said generator; a logical matrix of said means for representing information in the form of signs, having information inputs entered whereinto is decimal-coded information corresponding to a sign to be represented, said matrix also having readout inputs connected whereto are outputs of said pulse distributor; a sign information source connected to said information inputs; a quantized level circuit of said means for representing information in the form of signs, whose inputs are connected to outputs of said logical matrix; a galvanometer of said means for representing information in the form of signs, said galvanometer being electrically coupled to an output of said quantized level circuit; a mirror of said galvanometer whose rotation axis is roughly parallel to the direction of movement of said light-sensitive material and which reflects said light beam and shifts it along the surface of said light-sensitive material in the direction which is roughly perpendicular to the direction of movement of said light-sensitive material.

2. A device as claimed in claim 1, comprising: at least one additional logical matrix of said means for representing information in the form of signs, having readout inputs connected whereto are the outputs of said pulse distributor, and also having information inputs; additional sign information sources whose number is equal to that of the additional logical matrices, outputs of each additional sign information source being connected to said information inputs of the respective logical matrix; additional quantized level circuits whose number is equal to that of the additional logical matrices, inputs of each additional quantized level circuit being connected to the outputs of the respective additional logical matrix; additional galvanometers whose number is equal to that of the additional logical matrices, said additional galvenometers being electrically coupled to the outputs of the respective additional quantized level circuits.

3. A light beam oscillograph comprising; a light source; light beams produced by said light source; a tape transport mechanism; a light-sensitive material movable by said tape transport mechanism; a group of galvanometers; mirrors of said group of galvanometers, the rotation axis of said mirrors being roughly parallel to the direction of movement of said light-sensitive material, said mirrors reflecting said light beams and shifting them along the surface of said light-sensitive material in the direction roughly perpendicular to the direction of movement of said light-sensitive material; at least one analog information source electrically coupled to a respective galvanometer and controlling said galvanometer so that said light-sensitive material reproduces analog information under the action of a respective light beam reflected from said mirror of said galvanometer; a means for representing information in the form of signs, which means forms respective light beams and projects them on said light-sensitive material in the form of signs; a reference frequency generator of said means for representing information in the form of signs; a pulse distributor of said means for representing information in the form of signs, whose input is connected to an output of said generator; logical matrices of said means for representing information in the form of signs in a number corresponding to that of the other galvanometers of said group of galvanometers, said matrices having information inputs entered whereinto is decimal-coded information corresponding to a sign to be represented, said matrices also having readout inputs connected whereto are outputs of said pulse distributor; sign information sources connected to said information inputs; quantized level circuits of said means for representing information in the form of signs in a number corresponding to that of said matrices, inputs of said quantized level circuits being connected to outputs of the respective logical matrices; said other galvanometers of said group of galvanometers incorporated in said means for representing information in the form of signs, which galvanometers are electrically coupled to the outputs of the respective quantized level circuits and controlled by them so that recorded on said light-sensitive material, simultaneously with analog information and under the action of said light beams reflected from said mirrors of said galvanometers, is information in the form of signs.

* * * * *